(12) United States Patent
Klapper et al.

(10) Patent No.: US 8,669,773 B2
(45) Date of Patent: Mar. 11, 2014

(54) METHOD OF CALIBRATING A PARTIAL DISCHARGE MEASURING DEVICE

(75) Inventors: Ulrich Klapper, Rankweil (AT); Harald Emanuel, Berlin (DE); Caspar Steineke, Berlin (DE)

(73) Assignee: Omicron Electronics GmbH, Klaus (AT)

( * ) Notice: Subject to any disclaimer, the term of this patent is extended or adjusted under 35 U.S.C. 154(b) by 435 days.

(21) Appl. No.: 13/034,509

(22) Filed: Feb. 24, 2011

(65) Prior Publication Data

US 2011/0204899 A1 Aug. 25, 2011

(30) Foreign Application Priority Data

Feb. 24, 2010 (EP) ..................................... 10001913

(51) Int. Cl.
*G01R 35/00* (2006.01)
*G01R 31/00* (2006.01)

(52) U.S. Cl.
USPC ..................................... 324/750.02; 324/601

(58) Field of Classification Search
USPC .......... 324/532, 527, 510, 500, 533, 536, 551, 324/601, 750.02, 74, 130, 202, 512; 702/85
See application file for complete search history.

(56) References Cited

U.S. PATENT DOCUMENTS

| | | | |
|---|---|---|---|
| 3,711,764 A * | 1/1973 | Ernst | 324/312 |
| 3,991,364 A | 11/1976 | Wiznerowicz | |
| 4,608,993 A * | 9/1986 | Albert | 600/457 |
| 5,323,117 A | 6/1994 | Endoh | |
| 5,381,100 A * | 1/1995 | Hayashi | 324/601 |
| 5,729,145 A | 3/1998 | Blades | |
| 6,101,399 A * | 8/2000 | Raleigh et al. | 455/561 |
| 6,161,077 A | 12/2000 | Fawcett | |
| 6,424,162 B1 * | 7/2002 | Rokunohe et al. | 324/551 |
| 6,774,639 B1 * | 8/2004 | Unsworth | 324/547 |
| 7,526,701 B2 * | 4/2009 | Wu et al. | 714/734 |
| 2010/0295555 A1 * | 11/2010 | Emanuel et al. | 324/601 |
| 2012/0077444 A1 * | 3/2012 | McMeekin et al. | 455/67.11 |

FOREIGN PATENT DOCUMENTS

| | | |
|---|---|---|
| DE | 3912654 | 3/1990 |
| EP | WO2005/121821 | 12/2005 |
| EP | 2071342 | 6/2009 |
| WO | WO 2005121821 | 12/2005 |

* cited by examiner

*Primary Examiner* — Hoai-An D Nguyen
(74) *Attorney, Agent, or Firm* — Workman Nydegger

(57) ABSTRACT

This invention concerns a method and devices for calibrating a partial discharge measuring device and for locating faults on cables. In the method, calibration signals, which can include a band-limited white noise, are used with a periodically repeated signal course. By averaging over a predetermined period duration (T) of the calibration signal, it is possible, in the case of a partial discharge measurement, to recalibrate the measuring device continuously during the measurement, and additionally on cables to determine the fault location with great precision.

20 Claims, 3 Drawing Sheets

41 : Partial Discharge Measuring Device
43 : Partial Discharge Arithmetic Unit
50 : Averager
61 : Test Object

| 41 : Partial Discharge Measuring Device |
| 43 : Partial Discharge Arithmetic Unit |
| 50 : Averager |
| 61 : Test Object |

41 : Partial Discharge Measuring Device
43 : Partial Discharge Arithmetic Unit
48 : Auto-Correlator
49 : Auto-Correlator
50 : Averager
61 : Test Object

METHOD OF CALIBRATING A PARTIAL DISCHARGE MEASURING DEVICE

CROSS-REFERENCE TO RELATED APPLICATIONS

This application claims the benefit of European Patent Application No. EP 10001913.2, filed on Feb. 24, 2010, the disclosure of which is incorporated herein in its entirety.

BACKGROUND OF THE INVENTION

This invention concerns a method of calibrating a partial discharge measuring device, a method of locating a flaw on a cable by analysing partial discharges, and corresponding systems.

To measure so-called partial discharges (PD) according to Standard IEC 60270, calibrating the measuring device before the actual measurement is prescribed and necessary. For calibration, a calibrating device is usually connected between the test object and earth, and feeds simulated partial discharge pulses of known charge into the test object. The partial discharge measuring device is set to a frequency band with low environmental interference levels, and is adjusted for this frequency band so that it displays precisely the charge which is fed in by the calibrating device. If the width or position of the frequency band changes, recalibration is usually required. The pulse form for partial discharge calibration is prescribed in Standard IEC 60270, and comes close to a Dirac pulse, i.e. it involves short pulses of high amplitude with a broad frequency spectrum. The pulses are repeated at short intervals, to obtain a regular display on the measuring device. The partial discharge calibration signal can therefore be considered as a periodic signal, and a corresponding crest factor, which gives the ratio of peak values to root mean square values, can be calculated. In the case of the calibration signals described above, with pulse shape and high amplitude, the result is very high values for the crest factor. This means that the partial discharge measuring device to be calibrated must have a measuring range with high dynamics and high precision.

The measuring signal is usually extracted using coupling capacitors which are attached for the measurement, or using capacitances which are inherently present in the system, e.g. capacitive implementations of transformers or circuit breakers or capacitive coatings which are present between the shield and core of power cables. The calibrating device which is connected for calibration is usually removed after calibration, since it cannot withstand the test voltage. A test voltage is then applied to the test object, and the actual partial discharge measurement is carried out.

In the case of a partial discharge measurement on a cable, the distance from a measuring device, which is usually at a cable end, to an imperfection at a fault location in the cable can usually be determined indirectly by determining signal transit times of interfering pulses. The fault location is usually determined by applying a test voltage to the cable. At the fault location, partial discharge pulses then occur. The pulses have a certain transit time until they reach the measuring device. Because, at the cable end, for each pulse there is an echo, the difference of the transit times between pulse and echo can be measured. If the fault location is very near the end of the cable, the transit time difference between pulse and echo is small. A large transit time difference indicates a fault near the measuring point. To be able to calculate precisely where the fault location is, the speed at which an interfering pulse is propagated in the cable must be known. This can be determined by means of a calibration pulse, which is preferably fed into the near cable end at the measuring device and reflected at the far end of the cable. The transit time is calculated, and the speed of the pulse propagation is determined from it. The speed depends on the temperature of the cable and the measurement frequency window under consideration.

From the above description, it becomes clear that calibration of a partial discharge measuring device according to the prior art is very resource-intensive, since the partial discharge measuring device must be recalibrated every time the frequency band is changed or the temperature of the test object changes. For calibration, each time, the test voltage must be switched off, the calibrating device must be connected, and after calibration and before the actual partial discharge measurement it must be removed again. Additionally, in the case of the calibration method according to the prior art, the requirements regarding the dynamics on measuring circuits of the partial discharge measuring device are high. The same applies to current methods of locating faults on cables.

SUMMARY

The object of this invention is therefore to provide appropriate simplified and improved methods.

According to this invention, this object is achieved by a method of calibrating a partial discharge measuring device according to claim 1, a method of locating faults on a cable according to claim 12, a partial discharge measuring system according to claim 13 and a cable fault location system according to claim 21. The dependent claims define preferred and advantageous embodiments of the invention.

According to this invention, a method of calibrating a partial discharge measuring device is provided. In the method, a periodic calibration signal with a periodically repeated signal course of predetermined period duration is generated. The periodic calibration signal is, for example, injected into a test object, and the partial discharge measuring device captures a measuring signal. The measuring signal can include multiple measuring signal sections, each with the predetermined period duration of the calibration signal. The predetermined period duration is used for averaging the measuring signal. For example, by averaging multiple measuring signal sections, each with the predetermined period duration, an averaged measuring signal section is determined. On the basis of this averaged measuring signal section, the partial discharge measuring device can then be calibrated. To determine the averaged measuring signal section, for example, many thousand measuring signal sections, which are captured in succession at the test object, can be used, while the periodic calibration signal is injected into the test object. Since a periodic calibration signal with a defined amplitude course is fed in, this calibration signal, compared with other signals in the test object, e.g. a partial discharge measuring signal or an interfering signal, can be very small, since to calibrate the partial discharge measuring device, the fact that the calibration signal is periodic, so that by averaging over very many periods the calibration signal can be captured precisely, despite the low level, can be exploited.

These and other objects and features of the present invention will become more fully apparent from the following description and appended claims, or may be learned by the practice of the invention as set forth hereinafter.

BRIEF DESCRIPTION OF DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF DISCLOSED EMBODIMENTS

Figure 1:
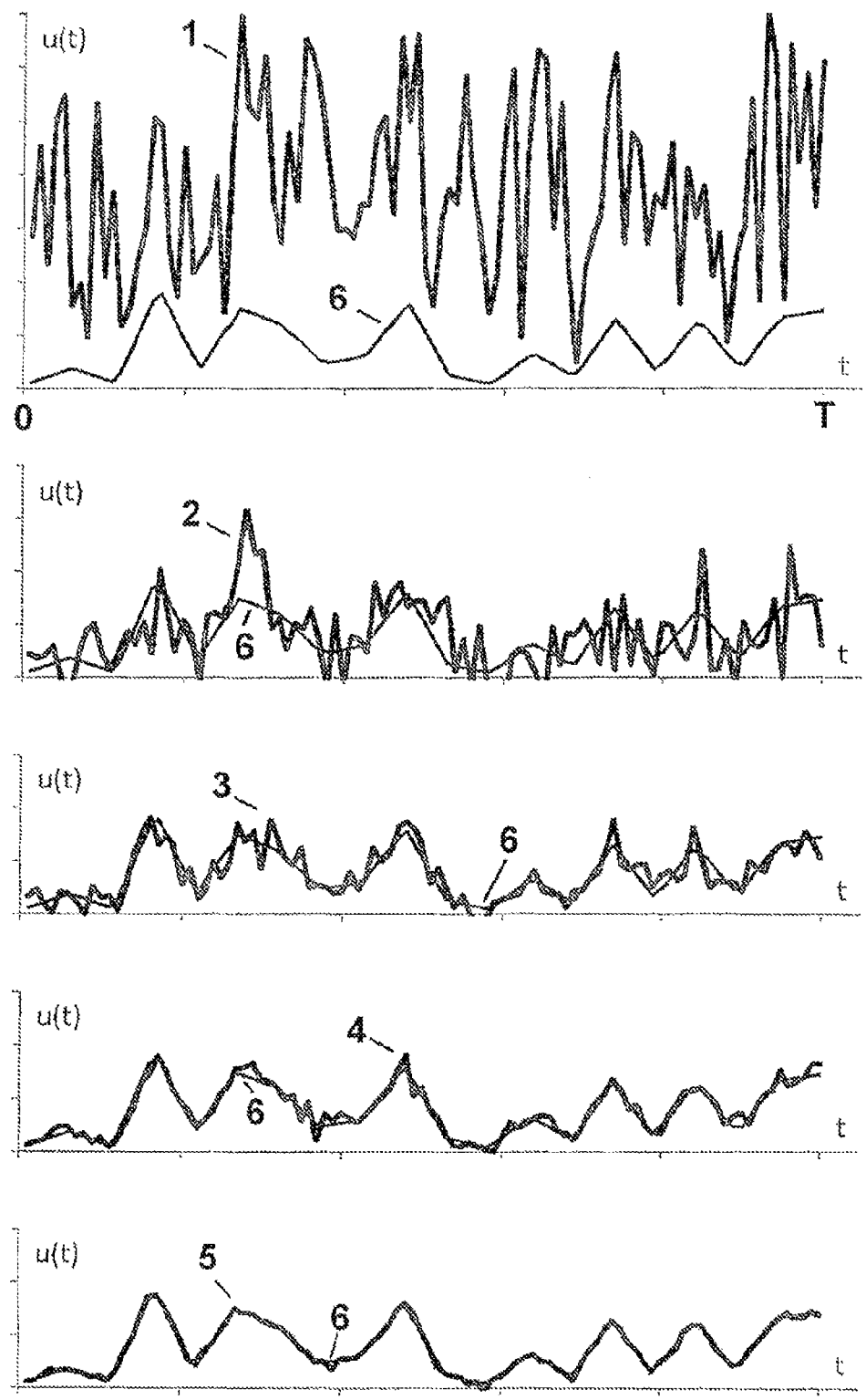
FIG. 1 shows schematically how, using an embodiment of a method according to the invention, interference in one measuring signal section is suppressed by averaging multiple measuring signal sections.

According to an embodiment, in the method a test voltage is applied to the test object while the periodic calibration signal is injected. In this way, a large time saving can be achieved in the execution of the partial discharge measurement, and the whole course of the partial discharge measurement can be simplified. In the case of a change of the frequency band in the partial discharge measuring device, e.g. a shift of a filter frequency of the partial discharge measuring device, switching the test voltage off and on is thus unnecessary, and instead the partial discharge measuring device can be calibrated with the test voltage switched on. The partial discharge measuring device can also be calibrated continuously while the test voltage is applied to the test object. Other possible changes in the system, e.g. the temperature of the test object, can thus be continuously detected and calibrated away. The amplitude of the periodic calibration signal is preferably chosen to be less than the expected amplitudes of partial discharges in the test object. Thus the calibration signal does not significantly affect the measurement result of the actual partial discharge pulses. Additionally, the smaller calibration signals can be connected to a test voltage potential via coupling capacitors more easily than large calibration signals or calibration signals with high dynamics.

According to a further embodiment, the signal course of the calibration signal includes a band-limited white noise. The band-limited white noise can, for example, be a white noise which is limited by a low-pass filter. White noise has a significantly smaller crest factor compared with repeated pulses, and also has the property of covering the whole spectrum within the limited frequency band.

According to a further embodiment, the white noise can be generated by means of a binary pseudo-random sequence, which is preferably then low-pass filtered.

According to a further embodiment, the periodic calibration signal can include a frequency mixture of multiple discrete frequencies. For example, the frequencies can be distributed in the spectrum so that the whole possible range of the partial discharge measurement is covered. By suitable choice of the discrete frequencies, periodicity of the whole sequence is achieved. The periodicity of the whole frequency corresponds to the greatest common denominator of the discrete frequencies. If a 2 kHz and a 3 kHz signal are used as the discrete frequencies, the result is a frequency for the calibration signal of 1 kHz. In a further example, if a 2 kHz and a 3.1 kHz signal are used as the discrete frequencies, the result is a periodic calibration signal with a frequency of 100 Hz. By optimising the phase position between the discrete frequencies, a further reduction of the crest factor can be achieved.

Since the injected periodic calibration signal can be small compared with a partial discharge measuring signal corresponding to a partial discharge in the test object, the calibration signal can be applied continuously during the actual partial discharge measurement, without the partial discharge measurement being significantly influenced by it. The permanent presence of the calibration signal during the partial discharge measurement can be used to track the calibration continuously during the partial discharge measurement, and to readjust the partial discharge measuring device so that correct results are always displayed. This is advantageous, in particular, if the frequency band is shifted or the bandwidth is changed, but also if recalibration is necessary because of changes in the test object or changes in the partial discharge measuring device.

According to a further embodiment, the measuring signal is separated into at least two measurement paths according to, for example, a band-pass filter. In a first measurement path, averaging over the predetermined period duration is carried out, and then a partial discharge measurement is carried out. Since true partial discharges and interfering signals do not have precisely the predetermined period duration, they are invisible in this measurement path, and only the calibration signal is measured here. In a second measurement path, a traditional partial discharge measurement is carried out. If the calibration signal is chosen to be so small that it causes no significant change in the second measurement path, a partial discharge can be measured and the system can be calibrated simultaneously.

According to a further embodiment, it is possible to change a band-pass filter with the test voltage source switched on, and to carry out recalibration without switching the test voltage source off. This is possible because of the injection of the calibration signal at test voltage level and the low dynamics which are necessary when white noise is used. Alternatively, instead of white noise, a different periodic signal can be used.

According to a further embodiment of this invention, a frequency band of the periodic calibration signal is chosen so that frequencies of an interfering signal in the measuring signal have, in the chosen frequency band, smaller amplitudes than corresponding amplitudes of the periodic calibration signal. For example, a broadband calibration signal can be applied during the measurement, and then a range in the frequency band in which an interference level is small compared with the calibration signal can be determined. The calibration signal can preferably have a constant level over the frequency. The frequency response of the calibration signal is compared with the frequency response of the interference level, and a range with a large gap between calibration signal and interference level is determined. This range then also represents an optimal range of a frequency band for partial discharge measurement. The frequency band can be set using a band-pass filter, for example.

In the described method, the coherence between the calibration signal and the part of the partial discharge measuring device which measures the calibration signal is exploited. To ensure coherence, the partial discharge measuring device can be aligned with the calibration signal with respect to its phase position. This can be achieved, for example, using a so-called phase locked loop (PLL) in the partial discharge measuring device.

A further method of this invention makes it possible, if the test object includes an electrical cable with a flaw, to determine a fault location on the cable. For this purpose, a periodic calibration signal with a predetermined period duration is injected into the cable. The measuring signal is normally measured and captured near the injection, preferably at one end of the cable, together with partial discharge pulses which occur on the cable. As described above, an averaged measuring signal section is determined by averaging multiple measuring signal sections with the predetermined period duration of the measuring signal. In this way, because of the coherence of calibration signal and averaging, interfering signals can be suppressed arbitrarily well. For the averaged measuring signal section, a transit time between the periodic calibration signal and an echo of the periodic calibration signal is determined. Using the transit time, the distance to a cable position where the echo was generated is determined. The cable position where the echo is generated is preferably the end of the cable, but could also be an imperfection such as a break or short circuit of the cable. In this way, if the length is known, the transit time of pulses in a specified frequency band can be determined very precisely, or if the transit time in the case of at least one frequency is known, the length of the cable can be determined. If partial discharge pulses which occur on the cable are related in the same way without averaging, the fault location can be determined very precisely, and a new determination of the transit time because of temperature changes or changed measurement frequency bands is possible without having to switch off the test voltage. It is also possible, if the transit time on a cable is known at only one frequency, to determine the cable length at this frequency, and then to determine the group delay time on the cable at other frequencies, which are more suitable for partial discharge measurement.

According to a further embodiment, the calibration signal is a broadband periodic signal with the predetermined period duration, and the group delay time is determined in each case for a specified frequency range. For this purpose, averaging takes place over the predetermined period duration according to, for example, a band-pass filter, and then the time between the calibration signal and the echo from the cable end is determined. The now known group delay time is taken into account in the measurement of the transit time of the interfering pulses, and the measurement therefore becomes much more precise.

A further embodiment uses an auto-correlation method for transit time measurement.

According to a further embodiment, the partial discharge pulses which occur at the imperfection of the cable are not only used to determine the fault location, but also captured quantitatively. The calibration signal which is used to determine the transit time of the signal if the cable length is known, or the cable length if the transit time is known, can additionally be used for calibration, as described above.

According to a further embodiment, the calibration signal includes band-limited white noise.

According to a further embodiment, the calibration signal for determining the group delay time, cable length and calibration of the partial discharge system is injected even if test voltage is applied.

According to a further embodiment, the test object is a power cable. In particular with this equipment, the method of partial discharge measurement is usual, and can be simplified specially greatly by this invention.

According to this invention, a partial discharge measuring system is also provided. The partial discharge measuring system includes a partial discharge measuring device, which is designed for measuring a measuring signal on a test object, and a calibration signal generator, which is designed for generating a calibration signal. The calibration signal has a predetermined period duration. The partial discharge measuring device is designed to use the predetermined period duration for averaging the measuring signal.

According to an embodiment, the partial discharge measuring system is designed to carry out the method described above for calibrating the partial discharge measuring device, and therefore also includes the advantages described above.

According to this invention, a cable fault location system for locating faults on a cable is also provided. The cable fault location system includes a signal generating device to generate and inject a signal onto the cable, and a measuring system which is designed to determine a group delay time of the signal on the cable, and to determine a fault location on the basis of a ratio between the group delay time and a transit time of partial discharge pulses which occur on the cable.

According to an embodiment, the cable fault location system is designed to carry out the method described above for locating faults on the cable, and therefore also includes the advantages described above.

FIG. 1 shows a signal course 6 with a predetermined period duration T, which is repeated periodically and is injected into a test object as a calibration signal to calibrate a partial discharge measuring device. FIG. 1 also shows a measuring signal section 1, which shows a corresponding section of a measuring signal which is captured with the partial discharge measuring device on the test object while the signal course 6 is injected. The measuring signal section 1 thus includes a total signal from the signal course 6 and further signals on the test object. The further signals are mainly overlaid interfering signals, which are injected from the environment of the test object into the test object. The totality of the further signals can be considered as an interfering signal in relation to calibration of the partial discharge measuring device. Consequently, the measuring signal section 1 includes a total signal of the signal course 6 and the interfering signal.

FIG. 1 also shows various averaged measuring signal sections 2-5. An averaged measuring signal section 2-5 is formed by averaging multiple different measuring signal sections 1. Each measuring signal section 1 which is used for averaging has the predetermined period duration T of the signal course 6, and is captured phase-locked to the periodically repeated signal course 6. Consequently, every measuring signal section 1 which is used for averaging has the identical signal course 6, with identical phase position, and additionally an individual interfering signal, which from the point of view of the periodic calibration signal, i.e. with respect to the period duration and phase position of the signal course 6, can be seen as random. Assuming that the random interfering signals in the captured measuring signal sections 1 are unbiased, since for example they are taken from the test object via a capacitive coupling, the result is that the more the measuring signal sections 1 are averaged, the more the averaged measuring signal sections 2-5 approach the signal course 6. For example, the averaged measuring signal section 2 was formed by averaging ten measuring signal sections 1. For example, the averaged measuring signal section 3 was formed by averaging 50 measuring signal sections 1. For example, the averaged measuring signal section 4 was formed by averaging 200 measuring signal sections 1, and finally the averaged measuring signal section 5 was formed by averaging 1000 measuring signal sections 1. As can be seen in FIG. 1, the signal course 6, despite its small amplitude, can be filtered by averaging signals with overlaid interfering signals with great amplitude. The signal courses of FIG. 1 are shown as a voltage over time, for example.

Figure 2:
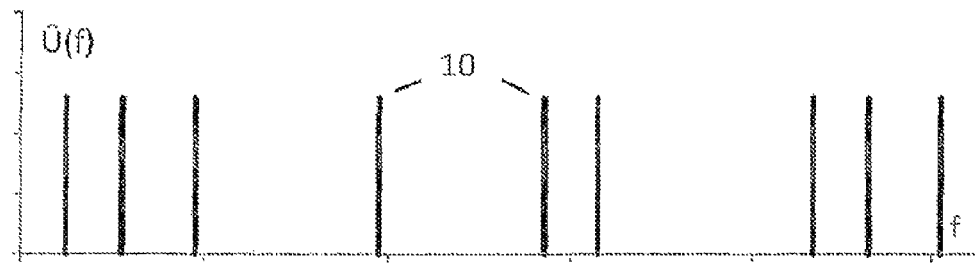
FIG. 2 shows a spectrum of a calibration signal formed from discrete frequencies.

As the signal course 6 for the periodic calibration signal, for example a pseudo-randomly generated and low-pass filtered white noise or a frequency mixture of discrete frequencies can be used. If a frequency mixture of discrete frequencies is used, the frequencies are preferably distributed in the frequency spectrum so that a total possible frequency range of a partial discharge measurement is covered, to ensure calibration of the partial discharge measuring device over the whole possible range of the partial discharge measurement. Additionally, the discrete frequencies can be chosen so that as few interference problems with signals of a partial discharge measurement as possible occur. For example, FIG. 2 shows a possible spectrum of discrete frequencies 10 which can be used to form the periodic calibration signal.

Figure 3:
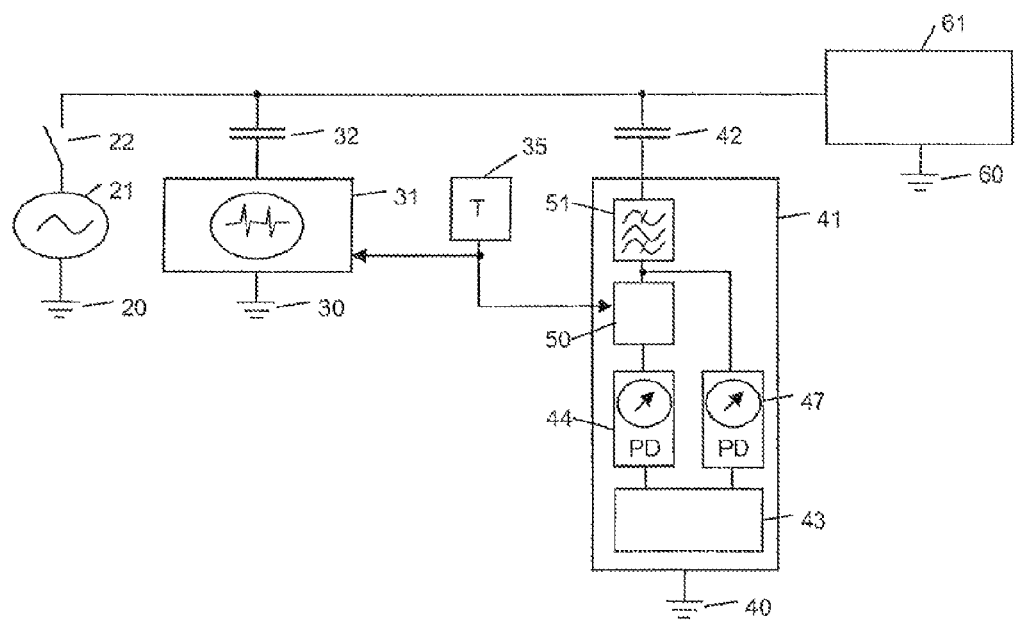
FIG. 3 shows a partial discharge measuring system according to an embodiment of this invention.

FIG. 3 shows a partial discharge measuring system for measuring partial discharges in a test object 61, a so-called device under test. The test object 61 is connected to earth potential via an earthing arrangement 60. The partial discharge measuring system includes a partial discharge measuring device 41, a calibration signal generator 31 and a test voltage source 21. For example, the test object 61 can be a power transformer or a power cable or any other power device with which partial discharges can occur. The partial discharge measuring device 41 is connected to the test object 61 via a coupling capacitor 42. The partial discharge measuring device 41 is also connected to earth potential via an earthing arrangement 40. The calibration signal generator 31 is connected to the test object 61 via a coupling capacitor 32. The calibration signal generator 31 is also connected to earth potential via an earthing arrangement 30. The test voltage source 21 can connect and disconnect a test voltage to the test object 61 via a switch 22, and is also connected to earth potential via an earthing arrangement 20.

The calibration signal generator 31 generates a periodic calibration signal with a periodically repeated signal course such as the signal course 6 shown in FIG. 1. The signal course 6 has a predetermined period duration T, which is provided by a time source 35 of the partial discharge measuring system. Via the coupling capacitor 32, the periodic calibration signal is injected into the test object 61. Via the coupling capacitor 42, a measuring signal from the test object 61 is fed to the partial discharge measuring device 41. The measuring signal includes partial discharge pulses, which may occur in the test object 61 because of the applied test voltage, interference which is injected externally, and the calibration signal, as described in relation to FIG. 1. In the partial discharge measuring device 41, as much interference as possible is filtered away at the input of the partial discharge measuring device 41 by a band-pass filter 51 of the partial discharge measuring device 41. The measurement path is then split. In one measurement path, using an averager 50 of the partial discharge measuring device 41, the measuring signal is averaged over the period duration T, which is provided by the time source 35, and the calibration signal can be filtered cleanly of interference and partial discharge pulses, even if its amplitude is significantly below that of other signals. The filtered calibration signal is measured like a normal partial discharge in a corresponding measuring unit 44 of the partial discharge measuring device 41. In the other measurement path, the actual partial discharge is measured in a corresponding measuring unit 47 of the partial discharge measuring device 41. By the choice of a very small calibration signal compared with the partial discharge, the calibration signal influences the actual partial discharge measurement only insignificantly. With the aid of a partial discharge arithmetic unit 43 of the partial discharge measuring device 41, the partial discharge measuring device 41 is calibrated on the basis of the filtered calibration signal.

By connecting the calibration signal generator 31 via a coupling capacitor 32, the test voltage source 21 can be switched on and simultaneously calibrated, which represents a considerable advantage compared with the prior art.

Figure 4:
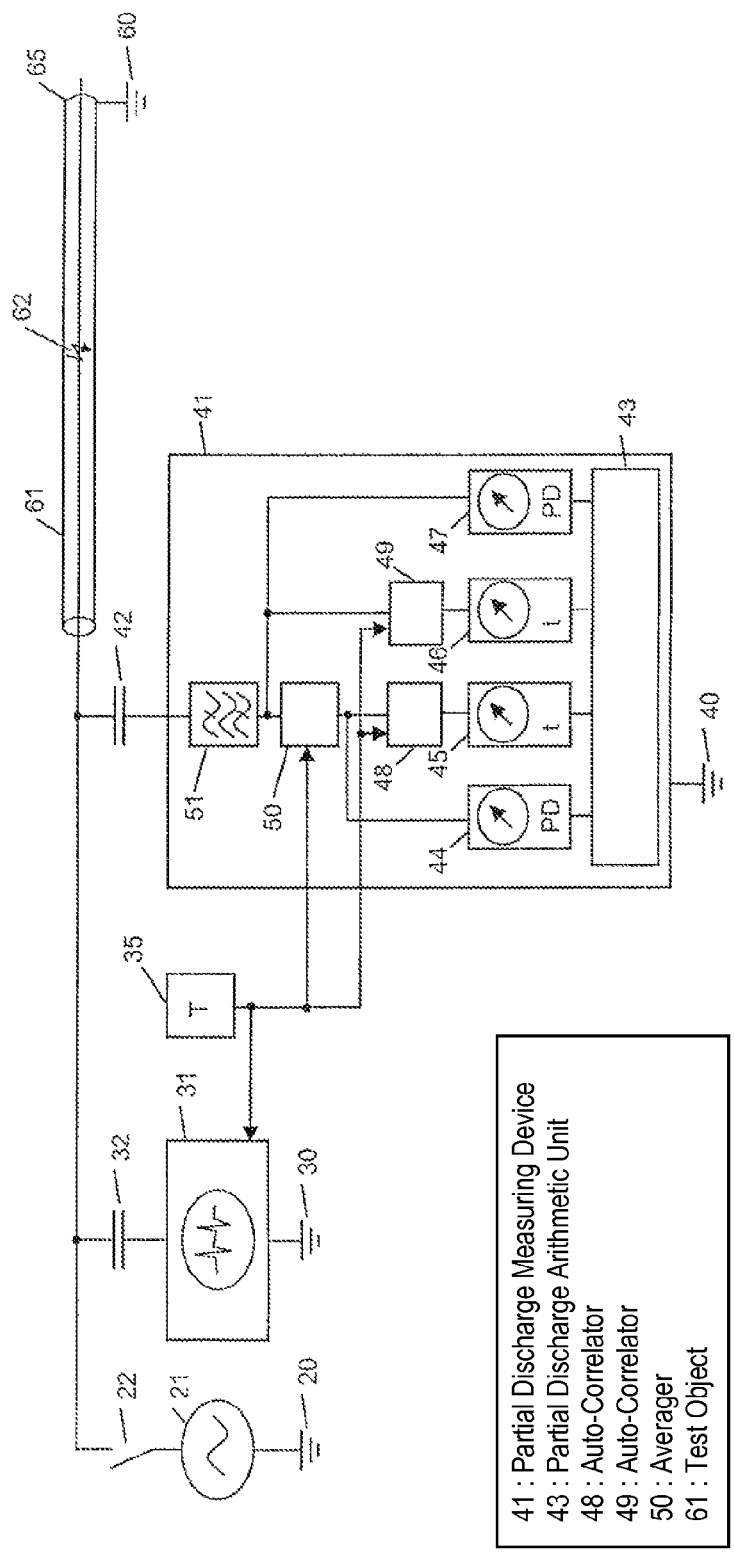
FIG. 4 shows a cable fault location system according to an embodiment of this invention.

For the case that the test object 61 is a cable, FIG. 4 shows a cable fault location and partial discharge measuring system, which as well as the possibility of measuring the partial discharges on the cable 61 as described in FIG. 3, can also determine the location or locations at which partial discharges occur in the cable 61. Components which have already been described in relation to FIG. 3 have the same reference symbols in FIG. 4, and are not described again.

Parallel to the two partial discharge measuring units 44 and 47 for the calibration signal and true partial discharges respectively, transit time measuring devices 45 and 46 are connected for time measurement. Because high frequency signals along a cable 61 have a certain transit time, and are also reflected at an open cable end 65, auto-correlation functions can be determined for the signals. An auto-correlator 48 for the calibration signal supplies time information to the time unit 45 corresponding to double the transit time of the signal from the calibration source 31 along the cable 61. In this way, if the transit time or propagation speed for a specified frequency is known, the cable length can be determined, or if the cable length is known, the transit time or propagation speed on the cable can be determined. The actual partial discharge information has shorter time information, which is determined by means of an auto-correlator 49 and the time measuring unit 46. The nearer an imperfection 62 and thus a partial discharge source is to the cable end 65, the smaller is the gap between direct reception and echo. Using the information from the time measuring units 45 and 46, the arithmetic unit 43 can determine the fault location exactly.

REFERENCE SYMBOL LIST 1 measuring signal section
2-5 averaged measuring signal section
6 periodically repeated signal course of a calibration signal
T period duration of the signal course
10 discrete frequencies
20 earthing arrangement of the test voltage source
21 test voltage source
22 switch for switching on the test voltage source
30 earthing arrangement of the calibration signal generator
31 calibration signal generator
32 coupling capacitor for injecting the calibration signal
35 time source with period duration T
40 earthing arrangement of the measuring system
41 measuring system
42 coupling capacitor for extracting the measuring signal
43 partial discharge and time arithmetic unit
44 device to measure the apparent charge of the calibration signal
45 transit time measuring device of the calibration signal
46 transit time measuring device for partial discharges
47 device to measure the apparent charge for partial discharges
48 auto-correlator for the calibration signal
49 auto-correlator for partial discharges
50 averager relative to T
51 preferably variable band-pass filter
60 earthing arrangement of the test object
61 test object
62 flaw along the cable
65 end of the cable The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. Method of calibrating a partial discharge measuring device, comprising the steps:
generating a calibration signal having a predetermined period duration using a calibration signal generator,
measuring a measuring signal on a test object,
averaging the measuring signal using the predetermined period duration of the calibration signal, and
calibrating the partial discharge measuring device on the basis of the averaged measuring signal.

2. Method according to claim 1, wherein
the calibration signal has a periodically repeated signal course with the predetermined period duration,
the calibration signal is injected into the test object,
in the averaging, multiple measuring signal sections of the measuring signal, each with the predetermined period duration, are averaged to an averaged measuring signal section with the predetermined period duration, and
the partial discharge measuring device is calibrated on the basis of the averaged measuring signal section.

3. Method according to claim 1, wherein the calibration signal is injected into the test object while a voltage from a test voltage source is applied to the test object.

4. Method according to claim 1, wherein the calibration signal includes a band-limited white noise.

5. Method according to claim 4, wherein the white noise is generated by means of a binary pseudo-random sequence.

6. Method according to claim 1, wherein the calibration signal includes multiple discrete frequencies.

7. Method according to claim 1, wherein the partial discharge measuring device is calibrated with an applied test voltage.

8. Method according to claim 1, wherein the measuring signal is carried in at least two measurement paths, in a first measurement path of the at least two measurement paths the measuring signal being averaged with the predetermined period duration, and the calibration signal being measured, and in a second measurement path of the at least two measurement paths the partial discharge being measured.

9. Method according to claim 1, wherein a frequency range of a band-pass filter is changed when a test voltage source is switched on, and wherein the partial discharge measuring device is recalibrated without the test voltage source being switched off.

10. Method according to claim 1, wherein a frequency band of a band-pass filter is chosen so that frequencies of interfering signals in the measuring signal in the chosen frequency band have essentially smaller amplitudes compared with the corresponding amplitudes of the calibration signal.

11. Method according to claim 1, wherein the predetermined period duration in the partial discharge measuring device is known and set by means of a PLL.

12. Method of calibrating a partial discharge measuring device, comprising the steps:
generating a calibration signal having a predetermined period duration using a calibration signal generator,
measuring a measuring signal on a test object, and
averaging the measuring signal using the predetermined period duration of the calibration signal,
wherein the measuring signal is carried in at least two measurement paths, in a first measurement path of the at least two measurement paths the measuring signal being averaged with the predetermined period duration, and the calibration signal being measured, and in a second measurement path of the at least two measurement paths the partial discharge being measured.

13. Partial discharge measuring system, including:
a partial discharge measuring device, which is designed for measuring a measuring signal on a test object, and
a calibration signal generator, which is designed for generating a calibration signal,
wherein the calibration signal has a predetermined period duration, and
wherein the partial discharge measuring device is designed to use the predetermined period duration for averaging the measuring signal for calibration of the partial discharge measuring device on the basis of the averaged measuring signal.

14. System according to claim 13, wherein the partial discharge measuring system is designed so that the averaged measuring signal comprises the average of multiple measuring signal sections.

15. System according to claim 13, wherein the partial discharge measuring system is designed so that the calibration signal comprises band-limited white noise.

16. System according to claim 13, wherein the partial discharge measuring device is configured to be calibrated with an applied test voltage.

17. System according to claim 16, wherein the partial discharge measuring device is configured to be calibrated without the test voltage source being switched off.

18. System according to claim 13, wherein the calibration signal generator generates a calibration signal that includes multiple discrete frequencies.

19. System according to claim 13, further comprising a band pass filter, the band pass filter configured to pass frequencies of interfering signals in the measuring signal with amplitudes smaller than the corresponding amplitudes of the calibration signal.

20. System according to claim 13, further comprising an autocorrelator configured to calculate a transit time from the calibration signal and a calibration signal echo.

* * * * *